(12) United States Patent
Sakamoto

(10) Patent No.: US 12,062,599 B2
(45) Date of Patent: Aug. 13, 2024

(54) POWER SEMICONDUCTOR MODULE

(71) Applicant: Mitsubishi Electric Corporation, Tokyo (JP)

(72) Inventor: Tatsuro Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 496 days.

(21) Appl. No.: 17/161,797

(22) Filed: Jan. 29, 2021

(65) Prior Publication Data

US 2021/0366813 A1 Nov. 25, 2021

(30) Foreign Application Priority Data

May 21, 2020 (JP) .................................. 2020-088572

(51) Int. Cl.
| | |
|---|---|
| *H01L 23/495* | (2006.01) |
| *H01L 23/00* | (2006.01) |
| *H01L 25/07* | (2006.01) |
| *H01L 25/18* | (2023.01) |

(52) U.S. Cl.
CPC .. *H01L 23/49575* (2013.01); *H01L 23/49568* (2013.01); *H01L 24/48* (2013.01); *H01L 25/072* (2013.01); *H01L 25/18* (2013.01); *H01L 2224/48175* (2013.01); *H01L 2924/10254* (2013.01); *H01L 2924/10272* (2013.01); *H01L 2924/1033* (2013.01)

(58) Field of Classification Search
None
See application file for complete search history.

(56) References Cited

U.S. PATENT DOCUMENTS

| | | | |
|---|---|---|---|
| 2013/0002227 A1* | 1/2013 | Ikeda | H02M 7/4837 323/311 |
| 2016/0351505 A1 | 12/2016 | Tamada et al. | |
| 2020/0258853 A1 | 8/2020 | Namba et al. | |
| 2020/0266134 A1* | 8/2020 | Kanda | H01L 23/49579 |

FOREIGN PATENT DOCUMENTS

| | | |
|---|---|---|
| WO | 2015/121899 A1 | 8/2015 |
| WO | 2019/064874 A1 | 4/2019 |
| WO | 2019/098368 A1 | 5/2019 |

OTHER PUBLICATIONS

Office Action dated Aug. 24, 2021 from the Japanese Patent Office in JP Application No. 2020-088572.

* cited by examiner

*Primary Examiner* — Michelle Mandala
*Assistant Examiner* — Jordan M Klein
(74) *Attorney, Agent, or Firm* — Sughrue Mion, PLLC; Richard C. Turner

(57) ABSTRACT

This power semiconductor module includes: a bus bar to which each of first main electrodes of semiconductor switching elements is joined; a heat-dissipating metal substrate to which each of second main electrodes of the semiconductor switching elements is joined; and a control gate terminal connected to each of gate pads of the semiconductor switching elements by a bonding wire, wherein at least two of the plurality of semiconductor switching elements are arranged adjacently to each other on the heat-dissipating metal substrate and electrically connected in parallel to form one arm.

12 Claims, 12 Drawing Sheets

POWER SEMICONDUCTOR MODULE

BACKGROUND OF THE INVENTION

1. Field of the Invention

The present disclosure relates to a power semiconductor module.

2. Description of the Background Art

In an electric vehicle such as an electric car or a plug-in hybrid car, a power conversion device such as an inverter is used for driving a motor by a high-voltage battery, and the power conversion device includes a power semiconductor module for converting power through switching operation. In the power semiconductor module, a semiconductor switching element for performing switching operation is provided on a heat-dissipating metal substrate, and the semiconductor switching element is connected to an external terminal and sealed by a sealing material such as resin or gel.

In the semiconductor switching element, loss according to current and voltage occurs through conduction and switching operation. In order that the increased temperature due to loss does not exceed breakage temperatures of the semiconductor switching element and surrounding members, rated power is set for the semiconductor switching element. In general, in a power semiconductor module for a large-current and high-voltage power conversion device, a large-sized semiconductor switching element is used for ensuring rated power for the power semiconductor module. However, from a viewpoint such as manufacturing technology or yield of the semiconductor switching element, there is a limitation on increasing the size of the semiconductor switching element. Therefore, in a power semiconductor module that requires a large power capacity, a plurality of semiconductor switching elements are connected in parallel so as to suppress heat generation per semiconductor switching element.

If a plurality of semiconductor switching elements are connected in parallel, due to variations in control signals or the like, current imbalance among the semiconductor switching elements occurs at the time of switching. When current imbalance occurs among the semiconductor switching elements, great loss occurs in some of the semiconductor switching elements. Therefore, it becomes necessary to use large semiconductor switching elements or use a large number of semiconductor switching elements, leading to increase in the size and the cost of the power semiconductor module. In this regard, proposed is a technology in which, using the structure of a control signal board in a module, an inductance deviation between control signal wires is reduced and thus variations in the control signals are suppressed (see, for example, Patent Document 1).

Patent Document 1: WO2019/064874

Such a conventional power semiconductor module has a problem that, when there is current imbalance due to variations in ground potentials among the semiconductor switching elements or variations in parasitic inductances among the semiconductor switching elements, the current imbalance cannot be suppressed.

SUMMARY OF THE INVENTION

The present disclosure has been made to solve the above problem, and an object of the present disclosure is to provide a power semiconductor module that reduces variations in control signals, variations in ground potentials, and variations in parasitic inductances among semiconductor switching elements and suppresses current imbalance among the semiconductor switching elements, with use of a simple structure.

A power semiconductor module according to the present disclosure includes: a plurality of semiconductor switching elements each having a first main electrode and a gate pad on a front surface and having a second main electrode on a back surface; a bus bar to which each of the first main electrodes of the semiconductor switching elements is joined; a heat-dissipating metal substrate to which each of the second main electrodes of the semiconductor switching elements is joined; and a control gate terminal connected to each of the gate pads of the semiconductor switching elements by a bonding wire, wherein at least two of the plurality of semiconductor switching elements are arranged adjacently to each other on the heat-dissipating metal substrate and electrically connected in parallel to form one arm.

The power semiconductor module according to the present disclosure includes: the plurality of semiconductor switching elements each having the first main electrode and the gate pad on the front surface and having the second main electrode on the back surface; the bus bar to which each of the first main electrodes of the semiconductor switching elements is joined; the heat-dissipating metal substrate to which each of the second main electrodes of the semiconductor switching elements is joined; and the control gate terminal connected to each of the gate pads of the semiconductor switching elements by the bonding wire, wherein at least two of the plurality of semiconductor switching elements are arranged adjacently to each other on the heat-dissipating metal substrate and electrically connected in parallel to form one arm. Thus, it becomes possible to reduce variations in control signals, variations in ground potentials, and variations in parasitic inductances among semiconductor switching elements and suppress current imbalance among the semiconductor switching elements, with use of a simple structure.

DETAILED DESCRIPTION OF THE PREFERRED EMBODIMENTS OF THE INVENTION

Figure 1:
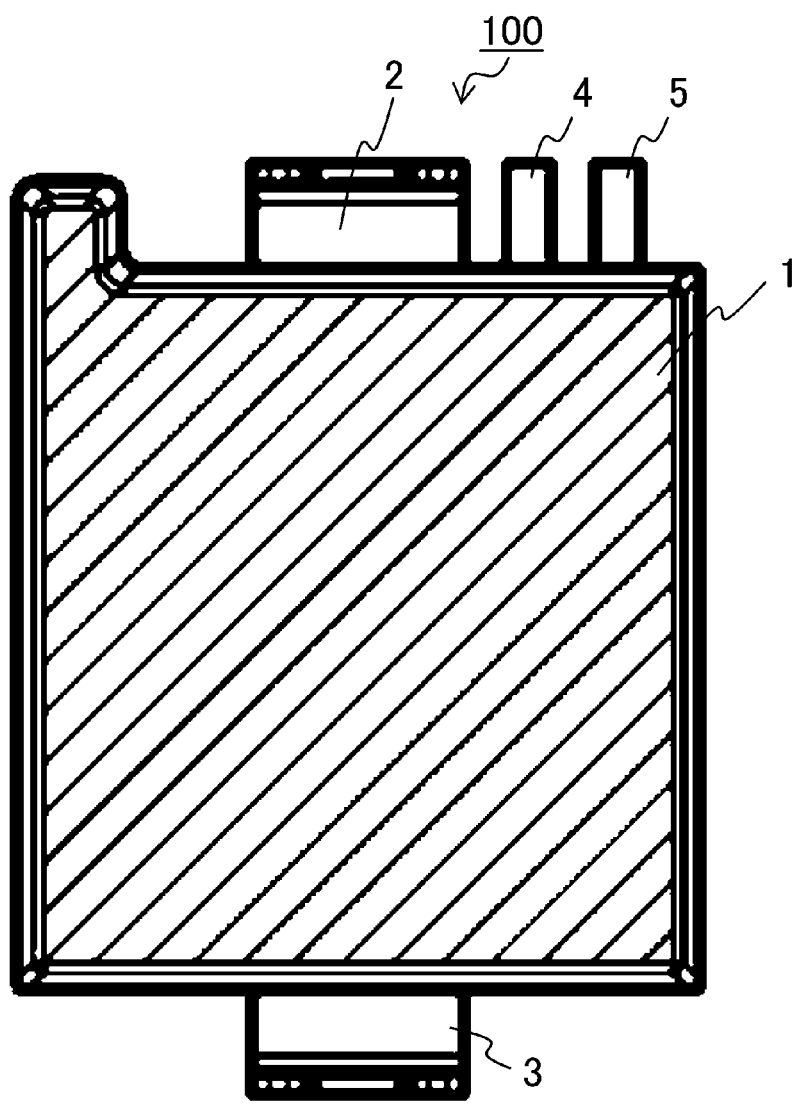
FIG. 1 is a view showing the outer appearance of a power semiconductor module according to the first embodiment of the present disclosure.

Hereinafter, power semiconductor modules according to embodiments for carrying out the present disclosure will be described in detail with reference to the drawings. In the drawings, the same reference characters denote the same or corresponding parts.

First Embodiment

Figure 2:
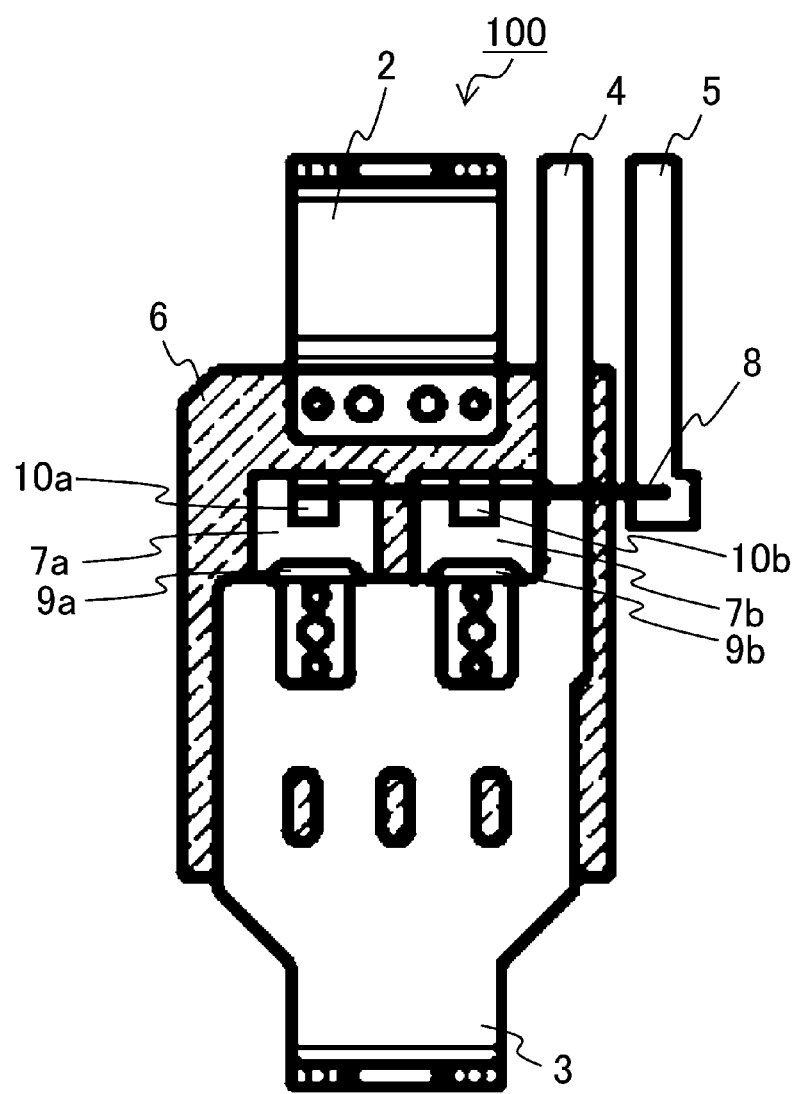
FIG. 2 is a view showing the internal structure of the power semiconductor module according to the first embodiment, from which a resin mold is removed.

FIG. 1 is a view showing the outer appearance of a power semiconductor module 100 according to the first embodiment of the present disclosure. FIG. 2 is a view showing the internal structure of the power semiconductor module 100 according to the first embodiment, from which a resin mold 1 is removed. The power semiconductor module 100 according to the first embodiment includes the resin mold 1, a P bus bar 2, an N bus bar 3, a control ground terminal 4, a control gate terminal 5, a heat-dissipating metal substrate 6, a semiconductor switching element 7a, a semiconductor switching element 7b, and a bonding wire 8. The semiconductor switching element 7a has a source electrode 9a and a gate pad 10a on a front surface, and has a drain electrode (not shown) on a back surface. The semiconductor switching element 7b has a source electrode 9b and a gate pad 10b on a front surface, and has a drain electrode (not shown) on a back surface. The semiconductor switching element 7a and the semiconductor switching element 7b are arranged adjacently to each other on the heat-dissipating metal substrate 6, and the drain electrodes of the semiconductor switching element 7a and the semiconductor switching element 7b are jointed to the heat-dissipating metal substrate 6 so as to be electrically connected therewith. The N bus bar 3 is provided on the semiconductor switching element 7a and the semiconductor switching element 7b, and the source electrode 9a of the semiconductor switching element 7a and the source electrode 9b of the semiconductor switching element 7b are joined to the N bus bar 3 so as to be electrically connected therewith. Thus, the semiconductor switching element 7a and the semiconductor switching element 7b are electrically connected in parallel between their drain electrodes and between their source electrodes, to form a pair of arms. The N bus bar 3 is connected to the control ground terminal 4, and one end of the N bus bar 3 is outputted to the outside of the resin mold 1. The bonding wire 8 is electrically connected to the gate pad 10a of the semiconductor switching element 7a and the gate pad 10b of the semiconductor switching element 7b, and an end of the bonding wire 8 is electrically connected to the control gate terminal 5. The control gate terminal 5 is outputted to the outside of the resin mold 1. The power semiconductor module 100 is sealed by the resin mold 1.

Solder is used for joining between the heat-dissipating metal substrate 6, and the semiconductor switching element 7a and the semiconductor switching element 7b. However, without limitation thereto, another joining method such as Ag sintering may be used. The heat-dissipating metal substrate 6 is a heat spreader made of copper. However, without limitation thereto, the heat-dissipating metal substrate 6 may be made from another substrate material, e.g., a direct bonded copper (DBC) substrate obtained by joining, to a copper base plate, a ceramic insulating substrate which is an insulating material with a metal foil bonded thereon by brazing or the like.

The power semiconductor module 100 is sealed by the resin mold 1 formed through transfer molding, for example. However, without limitation thereto, a resin case in which gel is injected, instead of the resin mold 1, may be used.

Figure 3:
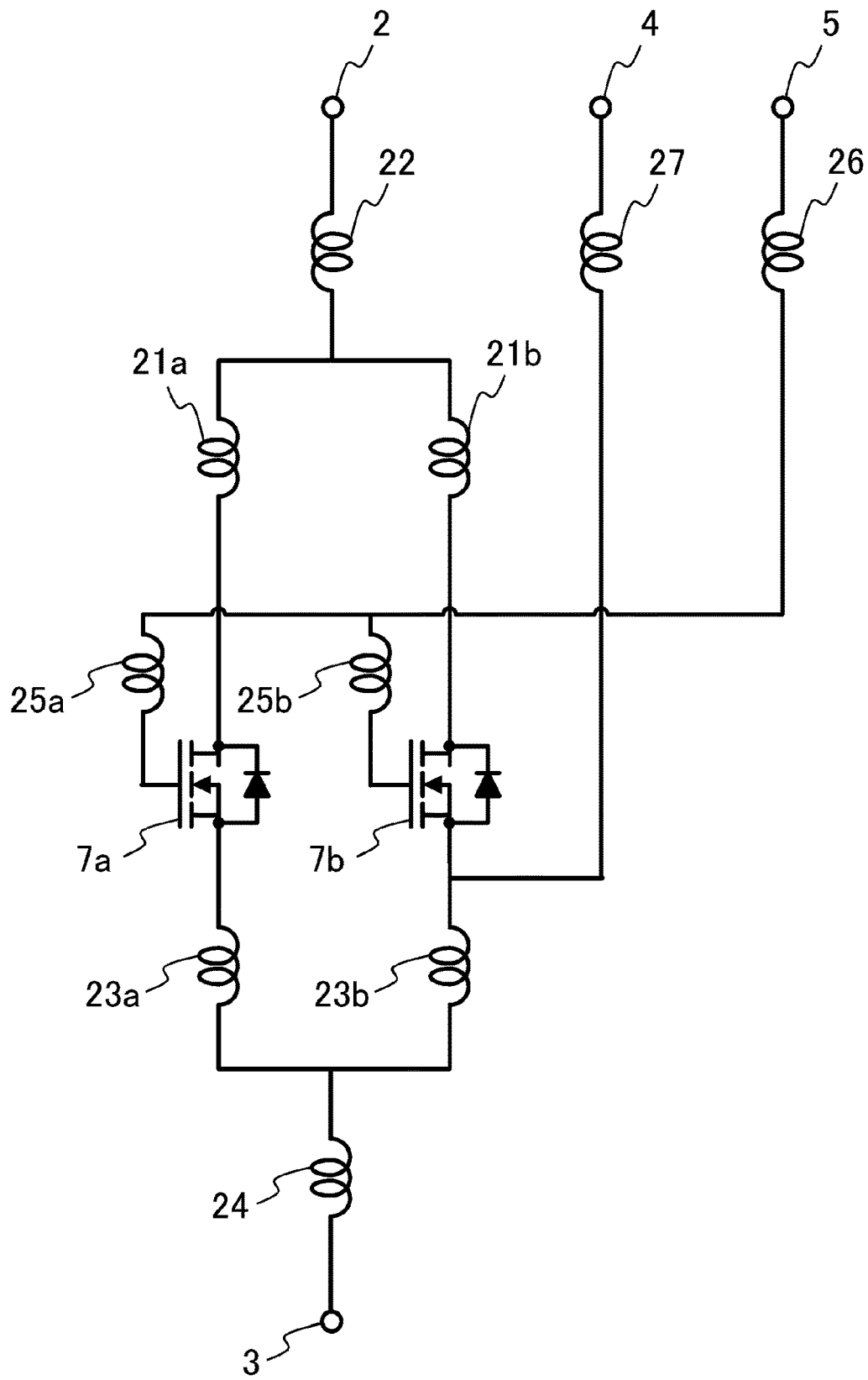
FIG. 3 is an equivalent circuit diagram of the power semiconductor module according to the first embodiment.

FIG. 3 is an equivalent circuit diagram of the power semiconductor module 100 according to the first embodiment. In FIG. 3, the semiconductor switching element 7a and the semiconductor switching element 7b are shown as metal-oxide-semiconductor field-effect transistors (MOSFET). However, without limitation thereto, insulated gate bipolar transistors (IGBT), bipolar transistors, or the like may be used. In the case of using IGBTs or bipolar transistors, the part described as "drain" is replaced with "collector", and the part described as "source" is replaced with "emitter". In FIG. 3, a configuration using a parasitic diode of the MOSFET as a flyback diode is shown. However, in the case of using a semiconductor switching element such as IGBT, which does not have a parasitic diode, a configuration in which a flyback diode is connected in antiparallel to the semiconductor switching element may be used.

In FIG. 3, a P-side parasitic inductance 21a, an N-side parasitic inductance 23a, and a gate control signal parasitic inductance 25a are parasitic inductances present on wires connected to the semiconductor switching element 7a, and a P-side parasitic inductance 21b, an N-side parasitic inductance 23b, and a gate control signal parasitic inductance 25b are parasitic inductances present on wires connected to the semiconductor switching element 7b. As other inductance components, a P-side common inductance 22, an N-side common inductance 24, a gate control signal common inductance 26, and a ground control signal common inductance 27 included in the power semiconductor module 100 commonly between the semiconductor switching element 7a and the semiconductor switching element 7b, are shown.

Next, the structure and the effects of the power semiconductor module 100 according to the first embodiment will be described. Current imbalance occurring between the semiconductor switching element 7a and the semiconductor switching element 7b is mainly due to two factors. The first factor is variations in parasitic inductances between P and N electrodes. The sum of inductance components of the P-side parasitic inductance 21a and the N-side parasitic inductance 23a of the semiconductor switching element 7a in FIG. 3 is denoted by La, the sum of inductance components of the P-side parasitic inductance 21b and the N-side parasitic inductance 23b of the semiconductor switching element 7b is denoted by Lb, a temporal current change amount during switching of the semiconductor switching element 7a is denoted by dIa/dt, and a temporal current change amount during switching of the semiconductor switching element 7b is denoted by dIb/dt. In this case, between drain-source voltages of the semiconductor switching element 7a and the semiconductor switching element 7b, a voltage difference represented by ΔVds in Expression (1) occurs.

$$\Delta Vds = La(dIa/dt) - Lb(dIb/dt) \quad (1)$$

In the semiconductor switching element, when drain-source voltage changes, conducting current changes. Therefore, due to occurrence of the drain-source voltage difference ΔVds, current imbalance occurs. If an inductance for suppressing variations in parasitic inductances between the P and N electrodes of the semiconductor switching element 7a and the semiconductor switching element 7b is intentionally added, the current imbalance can be suppressed, but adding the inductance causes a problem of increasing surge voltage and complicating the structure.

In the power semiconductor module 100 according to the first embodiment, as shown in FIG. 2, the semiconductor switching element 7a and the semiconductor switching element 7b are arranged adjacently to each other on the heat-dissipating metal substrate 6 and joined thereto, and the N bus bar 3 is provided on the semiconductor switching element 7a and the semiconductor switching element 7b and joined thereto, whereby the semiconductor switching element 7a and the semiconductor switching element 7b are electrically connected in parallel between their drain electrodes and between their source electrodes. The parasitic inductance of the semiconductor switching element increases in proportion to the length of the current path, and decreases in inverse proportion to the area of the current path. In the power semiconductor module 100, the distance between the semiconductor switching element 7a and the semiconductor switching element 7b serving as the current path is made short, and connection is made by a bus bar in which the area of the current path is large, instead of general connection by a bonding wire, whereby the P-side parasitic inductances 21a, 21b and the N-side parasitic inductances 23a, 23b are reduced. Thus, the sum La of the inductance components of the P-side parasitic inductance 21a and the N-side parasitic inductance 23a, and the sum Lb of the inductance components of the P-side parasitic inductance 21b and the N-side parasitic inductance 23b, are reduced, so that the drain-source voltage difference ΔVds is reduced, whereby current imbalance can be suppressed. The shorter the distance between the semiconductor switching element 7a and the semiconductor switching element 7b is, the more the current imbalance is suppressed. Therefore, the distance between the nearest points of the semiconductor switching element 7a and the semiconductor switching element 7b is set to, for example, 5 mm or less.

The second factor for current imbalance occurring between the semiconductor switching element 7a and the semiconductor switching element 7b is variations in gate voltages caused by variations in ground potentials and variations in control signals. Variations in ground potentials between the semiconductor switching elements are caused by variations between a product of the N-side parasitic inductance 23a and dIa/dt and a product of the N-side parasitic inductance 23b and dIb/dt. Variations in control signals are caused by magnetic coupling between each parasitic inductance in the circuit, and the gate control signal parasitic inductance 25a and the gate control signal parasitic inductance 25b. The magnitude of the influence of the magnetic coupling is proportional to the magnitudes of the inductance values and the magnitude of temporal change in current flowing through each parasitic inductance in the circuit.

In the power semiconductor module 100 according to the first embodiment, as shown in FIG. 2, the semiconductor switching element 7a and the semiconductor switching element 7b are arranged adjacently to each other on the heat-dissipating metal substrate 6 and joined thereto, and the N bus bar 3 is provided on the semiconductor switching element 7a and the semiconductor switching element 7b and joined thereto, whereby the N-side parasitic inductances 23a, 23b are reduced. Thus, variations in the ground potentials are suppressed.

In addition, on the semiconductor switching element 7a and the semiconductor switching element 7b arranged adjacently to each other, the bonding wire 8 is connected to the gate pad 10a and the gate pad 10b, and an end of the bonding wire 8 is connected to the control gate terminal 5. Here, the gate control signal parasitic inductance 25a is a parasitic inductance generated in the bonding wire 8 from the gate pad 10a of the semiconductor switching element 7a to the gate pad 10b of the semiconductor switching element 7b. In the power semiconductor module 100 according to the first embodiment, the semiconductor switching element 7a and the semiconductor switching element 7b are arranged adjacently to each other, and the distance between the gate pad 10a of the semiconductor switching element 7a and the gate pad 10b of the semiconductor switching element 7b is short. Therefore, the gate control signal parasitic inductance 25a can be reduced. Further, the gate control signal parasitic inductance 25b is a parasitic inductance generated in a part from the bonding wire 8 to the gate pad 10b of the semiconductor switching element 7b, and thus can be almost neglected. Since the magnitude of the influence of the magnetic coupling is proportional to the values of the inductances, variations in control signals can be suppressed. In the power semiconductor module 100 according to the first embodiment, variations in ground potentials are suppressed and variations in control signals are suppressed, whereby variations in the gate voltages are suppressed and thus current imbalance is suppressed.

Among magnetic fluxes generated in the power semiconductor module 100, a magnetic flux generated by P-N current is greatest, and the P-N current is a dominant factor in magnetic coupling between each parasitic inductance in the circuit, and the gate control signal parasitic inductance 25a and the gate control signal parasitic inductance 25b.

Therefore, if the N bus bar 3, the heat-dissipating metal substrate 6, and the bonding wire 8 are arranged such that the conduction direction of the P-N current flowing through the N bus bar 3 and the heat-dissipating metal substrate 6 and the direction of current flowing through the bonding wire 8 are perpendicular to each other, variations in control signals are further suppressed, whereby current imbalance can be further suppressed. In the case where, due to layout constraint, it is difficult to arrange the N bus bar 3, the heat-dissipating metal substrate 6, and the bonding wire 8 such that the conduction direction of the P-N current and the direction of current flowing through the bonding wire 8 are perpendicular to each other, current imbalance can be suppressed if the conduction direction of the P-N current and the direction of current flowing through the bonding wire 8 are at least different directions not parallel to each other. That is, it suffices that the N bus bar 3 and the bonding wire 8 are arranged such that the direction of current flowing through the N bus bar 3 and the direction of current flowing through the bonding wire 8 are different from each other, and the heat-dissipating metal substrate 6 and the bonding wire 8 are arranged such that the direction of current flowing through the heat-dissipating metal substrate 6 and the direction of current flowing through the bonding wire 8 are different from each other.

It has been described that the semiconductor switching element 7a and the semiconductor switching element 7b have the source electrodes 9a, 9b and the gate pads 10a, 10b on the front surfaces and have the drain electrodes on the back surfaces, but it suffices that either of the source electrodes 9a, 9b and the drain electrodes which are main electrodes are provided as first main electrodes on the front surfaces, and the other ones are provided as second main electrodes on the back surfaces. In the case where the drain electrodes and the gate pads 10a, 10b are provided on the front surfaces and the source electrodes 9a, 9b are provided on the back surfaces, the positive and negative sides of the bus bar are reversed and the control ground terminal 4 is connected to the heat-dissipating metal substrate 6.

In the power semiconductor module 100 according to the first embodiment, the number of the semiconductor switching elements is two, but the same effects are obtained if two or more semiconductor switching elements are provided. Current imbalance is influenced by the temporal change amount of current, and therefore, if the switching speed is fast, the influence on current imbalance increases. Therefore, in the case of using flyback diodes and semiconductor switching elements formed from, besides silicon (Si), silicon carbide (SiC), gallium nitride (GaN), or diamond which is a wide bandgap semiconductor having a wider bandgap than silicon so as to be capable of high-speed operation, the power semiconductor module 100 according to the first embodiment can obtain more significant effects.

As described above, the power semiconductor module 100 according to the first embodiment includes the plurality of semiconductor switching elements 7a, 7b having the first main electrodes 9a, 9b and the gate pads 10a, 10b on the front surfaces and having the second main electrodes on the back surfaces, the bus bar 3 to which each of the first main electrodes 9a, 9b of the semiconductor switching elements 7a, 7b is joined, the heat-dissipating metal substrate 6 to which each of the second main electrodes of the semiconductor switching elements 7a, 7b is joined, and the control gate terminal 5 connected to each of the gate pads 10a, 10b of the semiconductor switching elements 7a, 7b by the bonding wire 8, wherein at least two of the plurality of semiconductor switching elements 7a, 7b are arranged adjacently to each other on the heat-dissipating metal substrate 6 and electrically connected in parallel to form one arm. Thus, without adding unnecessary members, variations in control signals, variations in ground potentials, and variations in parasitic inductances between the semiconductor switching elements 7a, 7b are reduced, whereby current imbalance between the semiconductor switching elements 7a, 7b can be suppressed.

Second Embodiment

Figure 4:
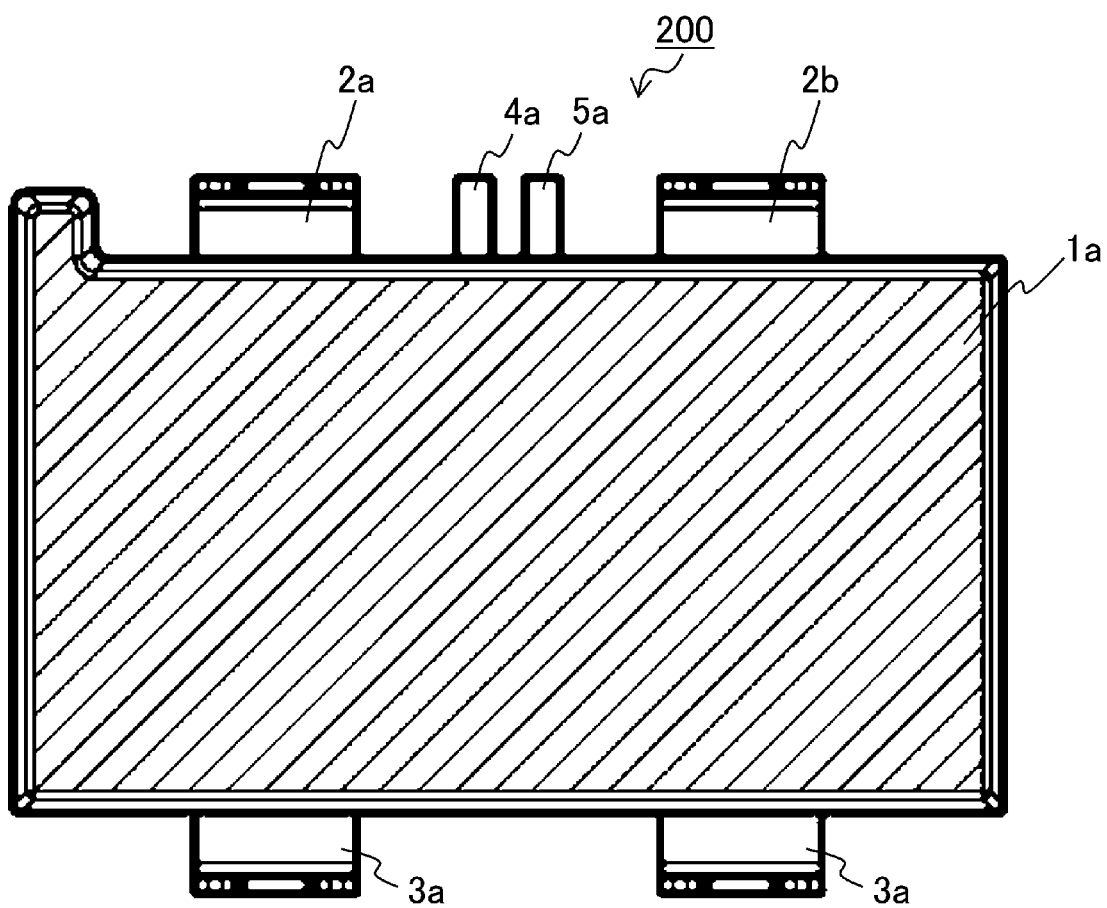
FIG. 4 is a view showing the outer appearance of a power semiconductor module according to the second embodiment of the present disclosure.
Figure 5:
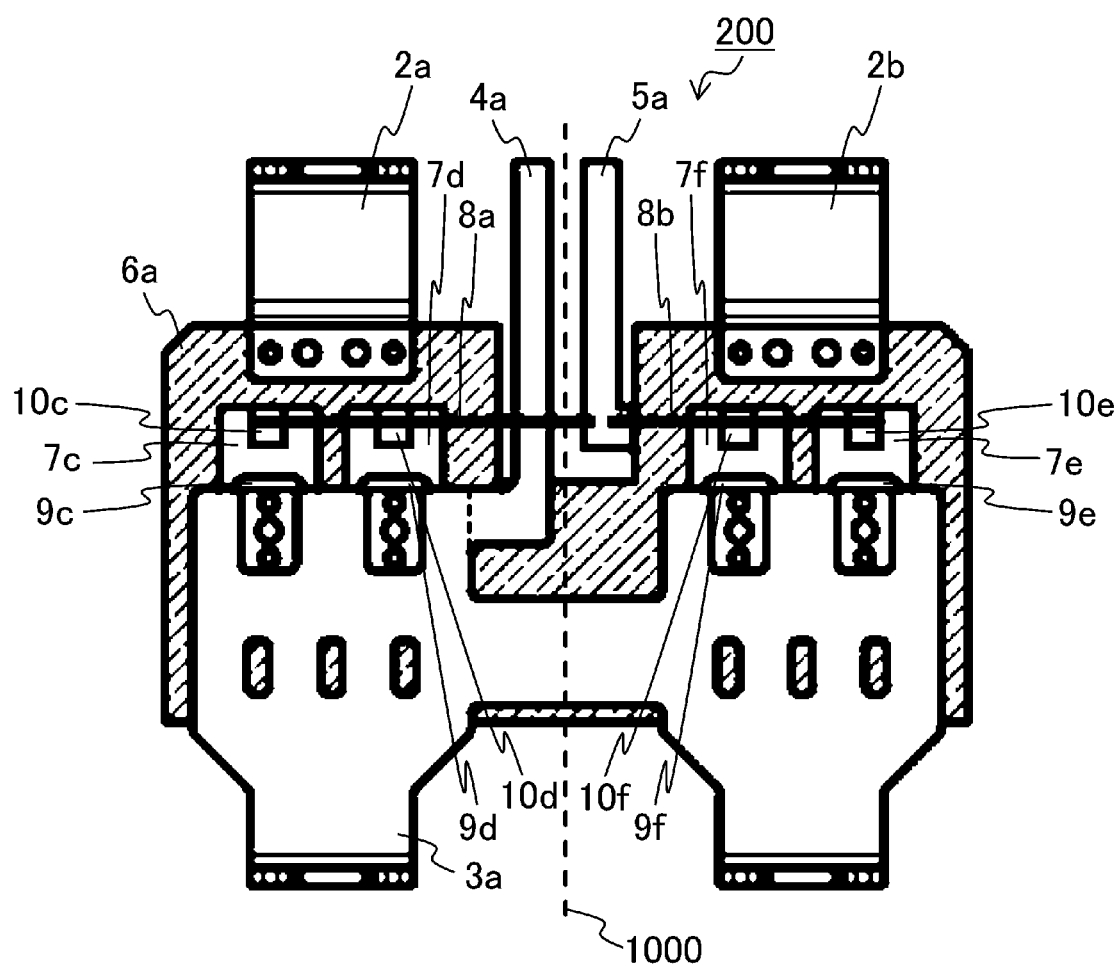
FIG. 5 is a view showing the internal structure of the power semiconductor module according to the second embodiment, from which a resin mold is removed.

FIG. 4 is a view showing the outer appearance of a power semiconductor module 200 according to the second embodiment of the present disclosure, and FIG. 5 is a view showing the internal structure of the power semiconductor module 200 according to the second embodiment, from which a resin mold 1a is removed. The power semiconductor module 200 according to the second embodiment is configured such that the power semiconductor modules 100 according to the first embodiment are arranged mirror-symmetrically with respect to a reference line 1000 as a symmetry axis.

The power semiconductor module 200 according to the second embodiment includes the resin mold 1a, P bus bars 2a, 2b, an N bus bar 3a, a control ground terminal 4a, a control gate terminal 5a, a heat-dissipating metal substrate 6a, semiconductor switching elements 7c, 7d, 7e, 7f, and bonding wires 8a, 8b. The semiconductor switching elements 7c, 7d, 7e, 7f are connected to one heat-dissipating metal substrate 6a, and connected to one N bus bar 3a. The semiconductor switching element 7c and the semiconductor switching element 7d are arranged adjacently to each other on the heat-dissipating metal substrate 6a, and the drain electrodes of the semiconductor switching element 7c and the semiconductor switching element 7d are joined to the heat-dissipating metal substrate 6a so as to be electrically connected therewith.

The N bus bar 3a is provided on the semiconductor switching element 7c and the semiconductor switching element 7d, and a source electrode 9c of the semiconductor switching element 7c and a source electrode 9d of the semiconductor switching element 7d are joined to the N bus bar 3a so as to be electrically connected therewith. Further, the semiconductor switching element 7e and the semiconductor switching element 7f are arranged adjacently to each other on the heat-dissipating metal substrate 6a, and the drain electrodes of the semiconductor switching element 7e and the semiconductor switching element 7f are joined to the heat-dissipating metal substrate 6a so as to be electrically connected therewith. The N bus bar 3a is provided on the semiconductor switching element 7e and the semiconductor switching element 7f, and a source electrode 9e of the semiconductor switching element 7e and a source electrode 9f of the semiconductor switching element 7f are joined to the N bus bar 3a so as to be electrically connected therewith. The bonding wire 8a is connected to a gate pad 10c of the semiconductor switching element 7c and a gate pad 10d of the semiconductor switching element 7d, and an end of the bonding wire 8a is connected to the control gate terminal 5a. In addition, the bonding wire 8b is connected to a gate pad 10e of the semiconductor switching element 7e and a gate pad 10f of the semiconductor switching element 7f, and an end of the bonding wire 8b is also connected to the same control gate terminal 5a.

In the power semiconductor module 200 according to the second embodiment, the structures of the semiconductor switching elements 7c, 7d, the N bus bar 3a, and the heat-dissipating metal substrate 6a are the same as the structures of the semiconductor switching elements 7a, 7b, the N bus bar 3, and the heat-dissipating metal substrate 6 in the power semiconductor module 100 of the first embodiment. Therefore, current imbalance between the semiconductor switching element 7c and the semiconductor switching element 7d is suppressed in the same manner as with current imbalance between the semiconductor switching element 7a and the semiconductor switching element 7b in the power semiconductor module 100 of the first embodiment. The structures of the semiconductor switching elements 7e, 7f and the heat-dissipating metal substrate 6a are mirror-symmetric with the structures of the semiconductor switching elements 7c, 7d and the heat-dissipating metal substrate 6a, and thus are the same as the structures of the semiconductor switching elements 7a, 7b, the N bus bar 3, and the heat-dissipating metal substrate 6 in the power semiconductor module 100 of the first embodiment. Therefore, current imbalance between the semiconductor switching element 7e and the semiconductor switching element 7f is suppressed in the same manner as with current imbalance between the semiconductor switching element 7a and the semiconductor switching element 7b in the power semiconductor module 100 of the first embodiment.

Figure 6:
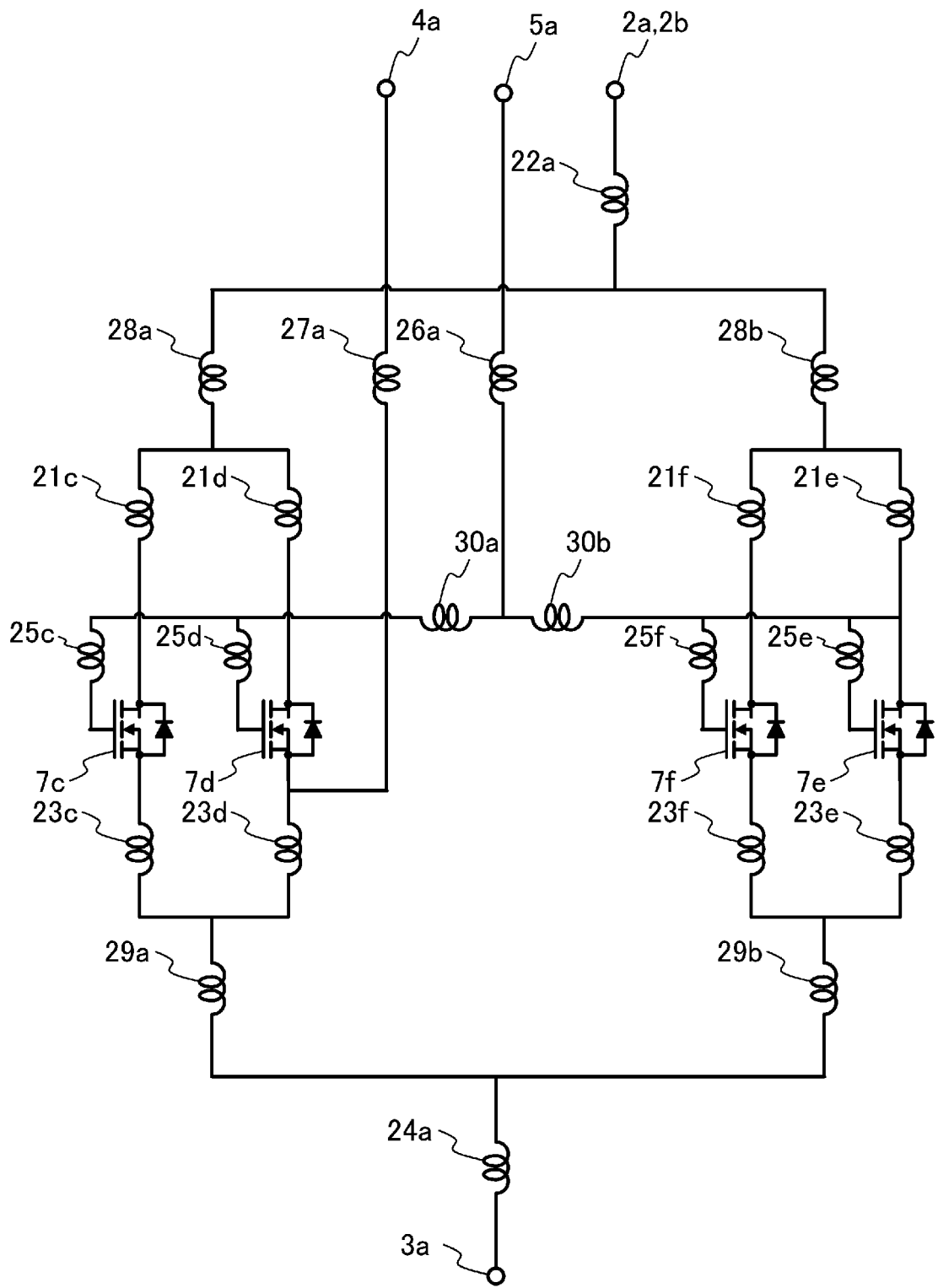
FIG. 6 is an equivalent circuit diagram of the power semiconductor module according to the second embodiment.

Next, an effect of suppressing current imbalance between the semiconductor switching elements 7c, 7d and the semiconductor switching elements 7e, 7f, which is a unique effect of the power semiconductor module 200 of the second embodiment, will be described. FIG. 6 is an equivalent circuit diagram of the power semiconductor module 200 according to the second embodiment. In FIG. 6, a P-side parasitic inductance 21c, an N-side parasitic inductance 23c, and a gate control signal parasitic inductance 25c are parasitic inductances present on wires connected to the semiconductor switching element 7c; a P-side parasitic inductance 21d, an N-side parasitic inductance 23d, and a gate control signal parasitic inductance 25d are parasitic inductances present on wires connected to the semiconductor switching element 7d; a P-side parasitic inductance 21e, an N-side parasitic inductance 23e, and a gate control signal parasitic inductance 25e are parasitic inductances present on wires connected to the semiconductor switching element 7e; and a P-side parasitic inductance 21f, an N-side parasitic inductance 23f, and a gate control signal parasitic inductance 25f are parasitic inductances present on wires connected to the semiconductor switching element 7f. As other inductance components, a P-side primary common inductance 28a, an N-side primary common inductance 29a, and a gate control signal primary common inductance 30a included in the power semiconductor module 200 commonly between the semiconductor switching element 7c and the semiconductor switching element 7d, are shown, and a P-side primary common inductance 28b, an N-side primary common inductance 29b, and a gate control signal primary common inductance 30b included in the power semiconductor module 200 commonly between the semiconductor switching element 7e and the semiconductor switching element 7f, are shown. Further, a P-side common inductance 22a, an N-side common inductance 24a, a gate control signal common inductance 26a, and a ground control signal common inductance 27a included in the power semiconductor module 200 commonly among the semiconductor switching elements 7c, 7d, 7e, 7f, are shown.

Regarding variations in parasitic inductances between P and N sides, the P-side parasitic inductances 21c, 21d, 21e, 21f and the N-side parasitic inductances 23c, 23d, 23e, 23f are reduced to be extremely small, and thus current imbalance due to these parasitic inductances is suppressed. In the power semiconductor module 200 of the second embodiment, the electrodes of the semiconductor switching elements 7c, 7d and the semiconductor switching elements 7e, 7f are joined to one heat-dissipating metal substrate 6a and one N bus bar 3a and connected in parallel, whereby the P-side primary common inductances 28a, 28b and the N-side primary common inductances 29a, 29b become small and thus current imbalance is suppressed.

In the power semiconductor module 200, arrangement of a first semiconductor switching element unit composed of the semiconductor switching elements 7c, 7d and a second semiconductor switching element unit composed of the semiconductor switching elements 7e, 7f, arrangement of the P bus bar 2a and the P bus bar 2b, the structure of the N bus bar 3a, and the structure of the heat-dissipating metal substrate 6a, are mirror-symmetric with respect to the reference line 1000 as the symmetry axis, so that the current conduction paths are mirror-symmetric between the semiconductor switching elements 7c, 7d and the semiconductor switching elements 7e, 7f. Thus, variations between the P-side primary common inductance 28a and the P-side primary common inductance 28b and variations between the N-side primary common inductance 29a and the N-side primary common inductance 29b are suppressed, so that current imbalance between the semiconductor switching elements 7c, 7d and the semiconductor switching elements 7e, 7f is further suppressed.

Here, it is described that the structure of the heat-dissipating metal substrate 6a is mirror-symmetric with respect to the reference line 1000 as the symmetry axis, but it suffices that a part corresponding to paths through which switching currents flow is mirror-symmetric. In addition, the control gate terminal 5a and the control ground terminal 4a not serving as paths through which switching currents flow need not be mirror-symmetric. In addition, in the case where a fixation point or the like is needed for manufacturing, the fixation point or the like need not be made mirror-symmetric, unless the fixation point or the like is at a position that influences the paths through which switching currents flow.

In addition, since arrangement of the semiconductor switching elements 7c, 7d and the semiconductor switching elements 7e, 7f, arrangement of the P bus bar 2a and the P bus bar 2b, the structure of the N bus bar 3a, and the structure of the heat-dissipating metal substrate 6a, are mirror-symmetric with respect to the reference line 1000 as the symmetry axis, variations in the N-side primary common inductance 29a and the N-side primary common inductance 29b are suppressed, so that variations in ground potentials among the semiconductor switching elements 7c, 7d, 7e, 7f are suppressed.

Further, of the bonding wire 8a which is a first bonding wire, a part connecting the gate pad 10c of the semiconductor switching element 7c and the gate pad 10d of the semiconductor switching element 7d, and of the bonding wire 8b which is a second bonding wire, a part connecting the gate pad 10e of the semiconductor switching element 7e and the gate pad 10f of the semiconductor switching element 7f, are arranged at positions mirror-symmetric with respect to the reference line 1000 as the symmetry axis. Thus, variations between the gate control signal primary common inductance 30a which is a parasitic inductance of the bonding wire 8a and the gate control signal primary common inductance 30b which is a parasitic inductance of the bonding wire 8b, can be suppressed, and variations in the influence of magnetic coupling caused between the bonding wire 8a and each parasitic inductance and in the influence of magnetic coupling caused between the bonding wire 8b and each parasitic inductance, can be equalized, whereby variations in control signals are suppressed. As a result, variations in gate voltages between the semiconductor switching elements 7c, 7d and the semiconductor switching elements 7e, 7f are suppressed, whereby current imbalance is suppressed.

Third Embodiment

Figure 7:
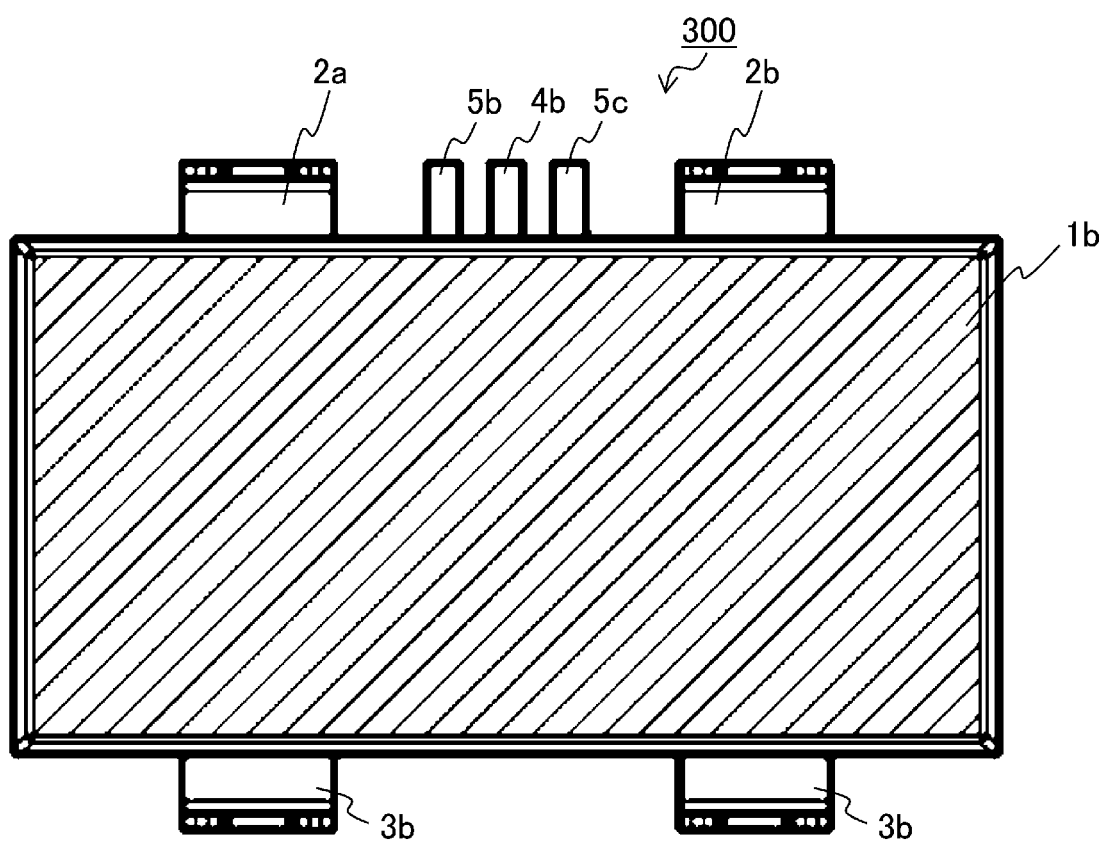
FIG. 7 is a view showing the outer appearance of a power semiconductor module according to the third embodiment of the present disclosure.
Figure 8:
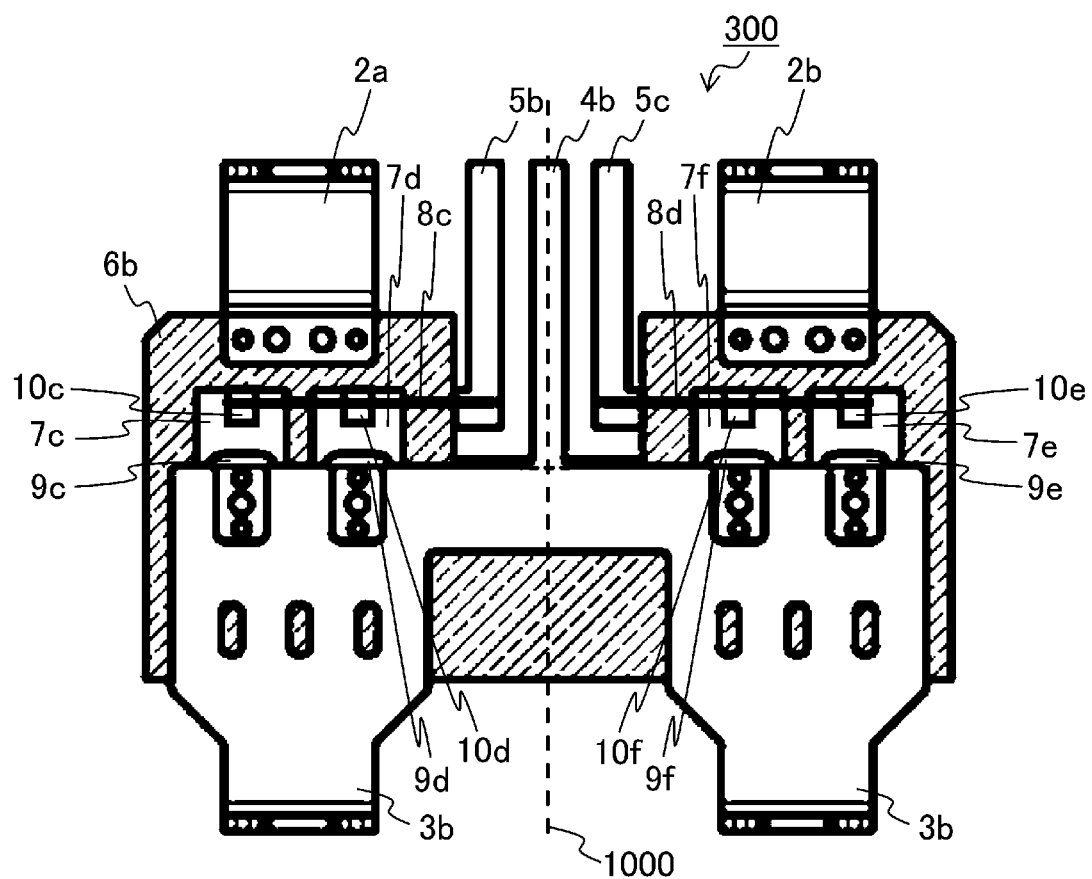
FIG. 8 is a view showing the internal structure of the power semiconductor module according to the third embodiment, from which a resin mold is removed.

FIG. 7 is a view showing the outer appearance of a power semiconductor module 300 according to the third embodiment of the present disclosure, and FIG. 8 is a view showing the internal structure of the power semiconductor module 300 according to the third embodiment, from which a resin mold 1b is removed. As compared to the power semiconductor module 200 according to the second embodiment, the power semiconductor module 300 according to the third embodiment is different in that a bonding wire 8c connected to the gate pad 10c of the semiconductor switching element 7c and the gate pad 10d of the semiconductor switching element 7d is connected to a control gate terminal 5b, a bonding wire 8d connected to the gate pad 10e of the semiconductor switching element 7e and the gate pad 10f of the semiconductor switching element 7f is connected to a control gate terminal 5c, the control gate terminal 5b which is a first control gate terminal and the control gate terminal 5c which is a second control gate terminal are mirror-symmetric with respect to the reference line 1000 as the symmetry axis, and the bonding wire 8c which is a first bonding wire and the bonding wire 8d which is a second bonding wire are mirror-symmetric with respect to the reference line 1000 as the symmetry axis. In addition, the shapes of an N bus bar 3b, a control ground terminal 4b, and a heat-dissipating metal substrate 6b are different from those in the power semiconductor module 200 according to the second embodiment, but the shapes of the N bus bar 3b and the heat-dissipating metal substrate 6b are mirror-symmetric with respect to the reference line 1000 as the symmetry axis, and this is the same as in the power semiconductor module 200 according to the second embodiment.

In the power semiconductor module 200 according to the second embodiment, currents flowing through the bonding wire 8a and the bonding wire 8b flow through one control gate terminal 5a, so that large current flows through the gate control signal common inductance 26a shown in FIG. 6. At this time, a voltage difference occurs in the gate control signal common inductance 26a of the control gate terminal 5a, and this causes erroneous ON operation due to increase in the gate voltages of the semiconductor switching elements 7c, 7d, 7e, 7f, for example, whereby the switching speed is restricted. In the power semiconductor module 300 according to the third embodiment, the bonding wire 8c which is a first bonding wire and the bonding wire 8d which is a second bonding wire are respectively connected to different control gate terminals, so that current flowing through one control gate terminal becomes small, whereby a voltage difference occurring in the control gate terminal can be suppressed. Thus, further high-speed switching can be performed.

Fourth Embodiment

Figure 9:
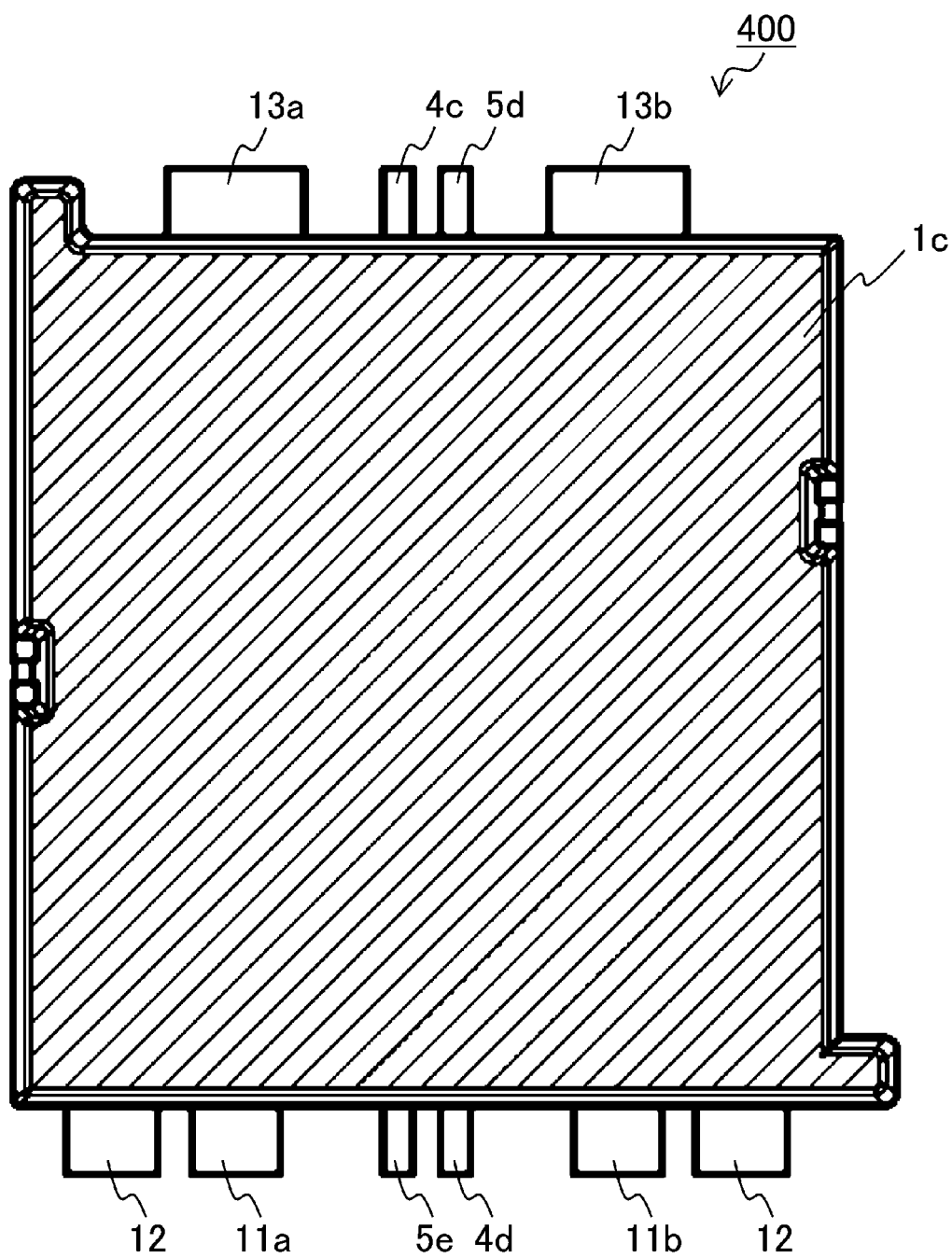
FIG. 9 is a view showing the outer appearance of a power semiconductor module according to the fourth embodiment of the present disclosure.
Figure 10:
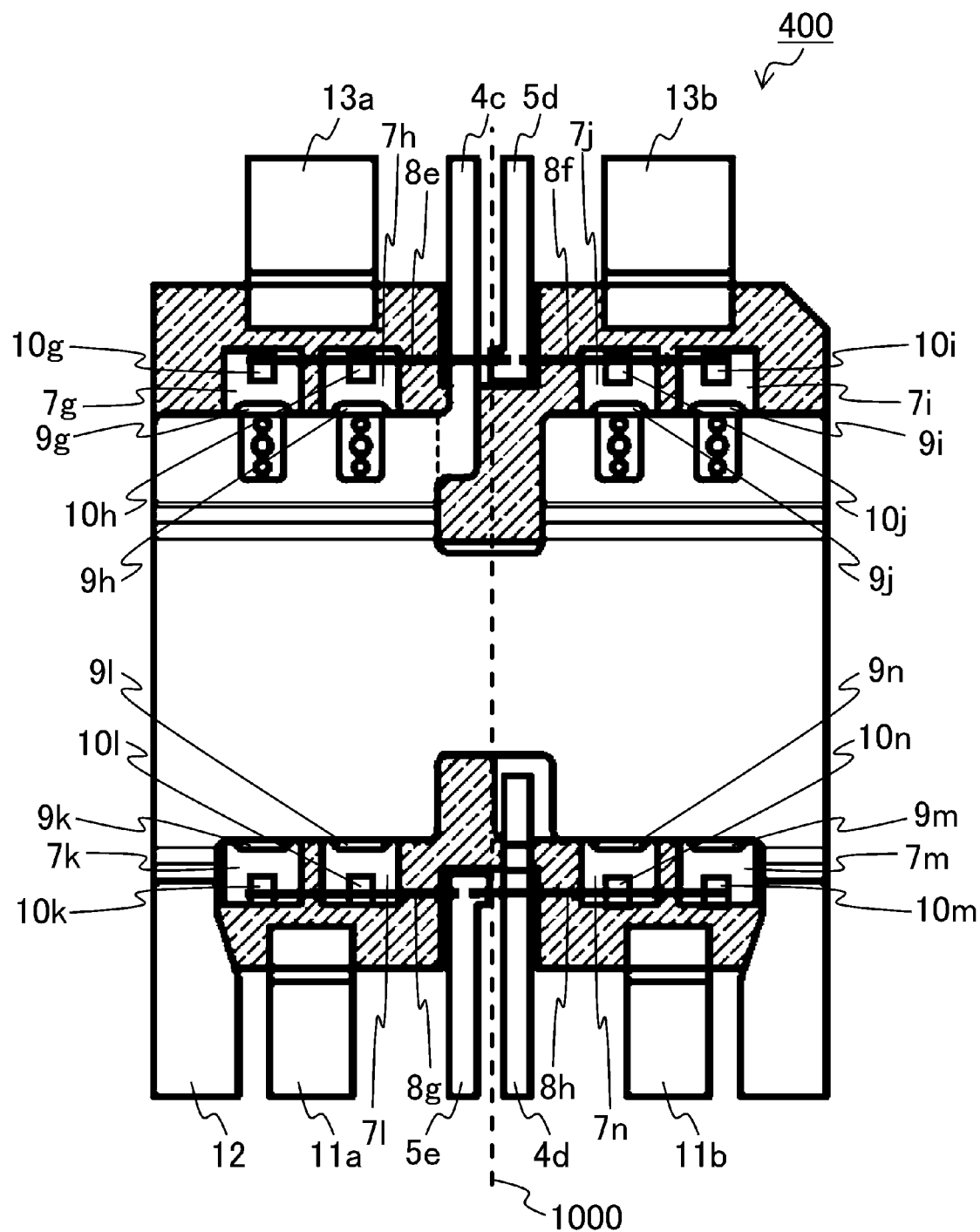
FIG. 10 is a view showing the internal structure of the power semiconductor module according to the fourth embodiment, from which a resin mold is removed.
Figure 11:
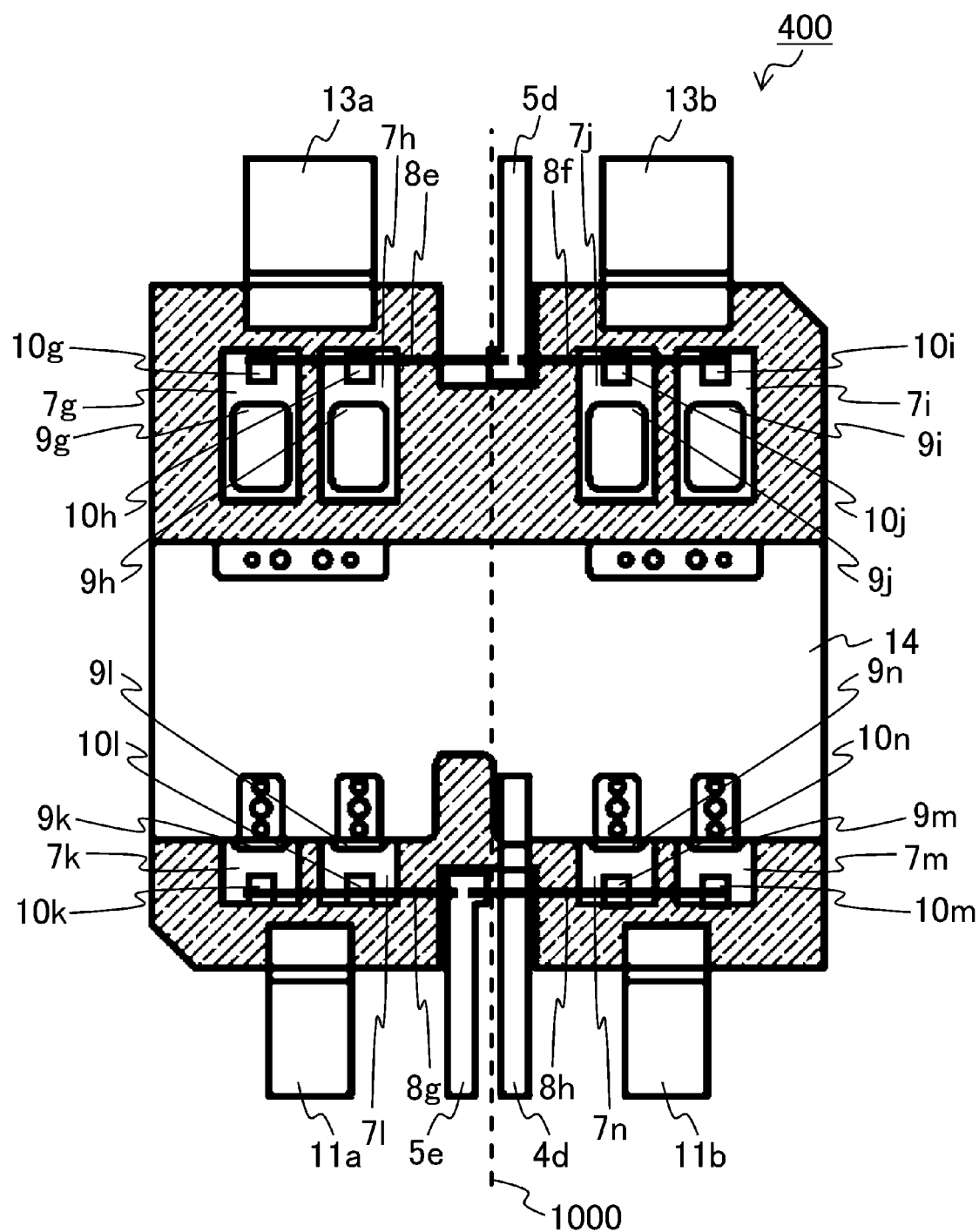
FIG. 11 is a view showing the internal structure of the power semiconductor module according to the fourth embodiment, from which the resin mold, a negative arm N bus bar, and a control ground terminal are removed.
Figure 12:
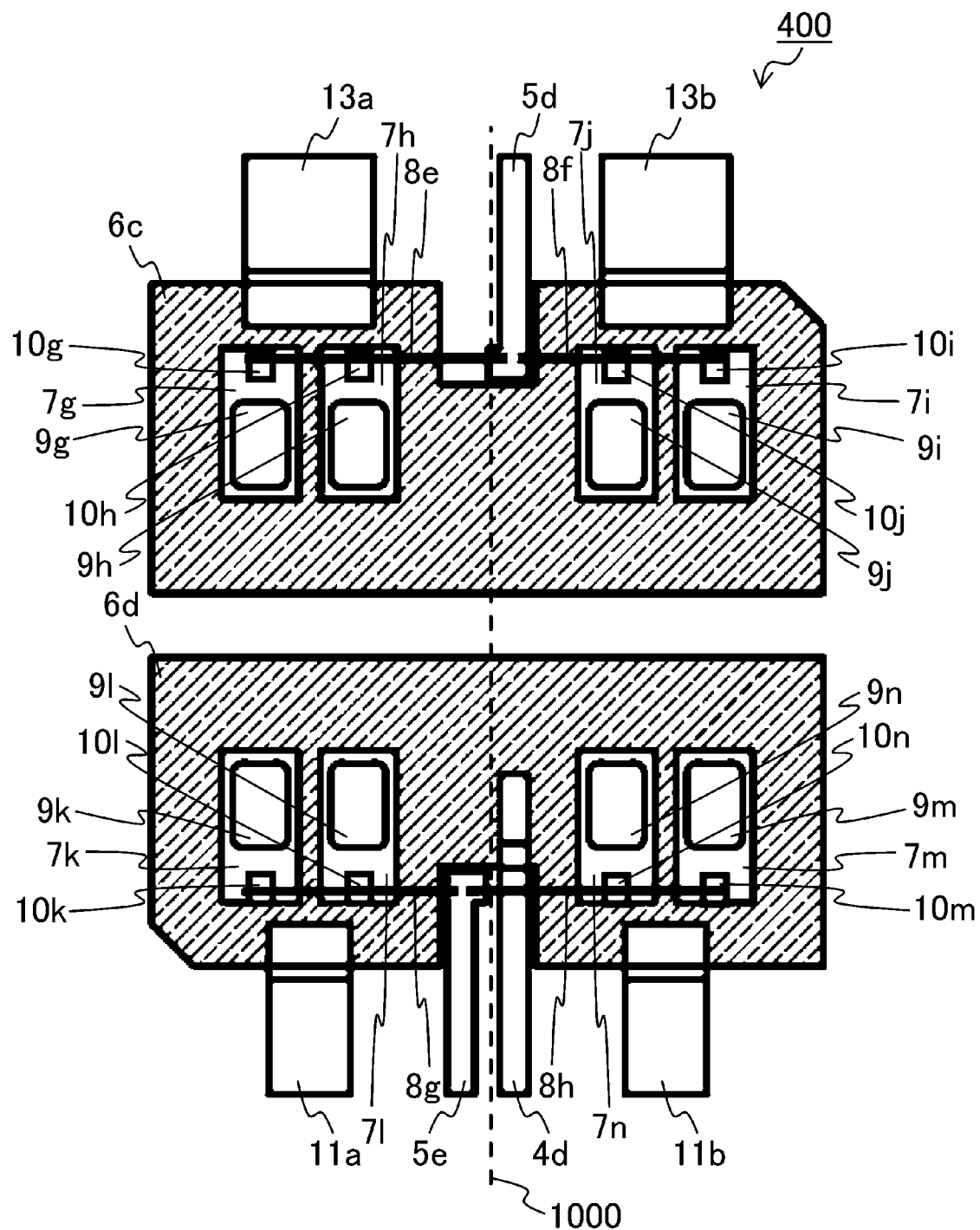
FIG. 12 is a view showing the internal structure of the power semiconductor module according to the fourth embodiment, from which the resin mold, the negative arm N bus bar, the control ground terminal, and an intermediate bus bar are removed.

FIG. 9 is a view showing the outer appearance of a power semiconductor module 400 according to the fourth embodiment of the present disclosure, and FIG. 10 is a view showing the internal structure of the power semiconductor module 400 according to the fourth embodiment, from which a resin mold 1c is removed. FIG. 11 is a view showing the internal structure of the power semiconductor module 400 according to the fourth embodiment, from which the resin mold 1c, a negative arm N bus bar 12, and a control ground terminal 4c are removed. FIG. 12 is a view showing the internal structure of the power semiconductor module 400 according to the fourth embodiment, from which the resin mold 1c, the negative arm N bus bar 12, the control ground terminal 4c, and an intermediate bus bar 14 are removed.

The power semiconductor module 400 according to the fourth embodiment has two arms, i.e., a positive arm and a negative arm, formed by semiconductor switching elements, and thus has a configuration called "2-in-1 module" in which the positive arm and the negative arm are connected in series. The power semiconductor module 400 according to the fourth embodiment is configured such that the power semiconductor module 200 according to the second embodiment and a power semiconductor module obtained by reversing the power semiconductor module 200 according to the second embodiment in the up-down direction are arranged side by side.

In the upper half of the power semiconductor module 400 according to the fourth embodiment, as compared to the power semiconductor module 200 according to the second embodiment, the P bus bars 2a, 2b are replaced with AC bus bars 13a, 13b, and the N bus bar 3a is replaced with the negative arm N bus bar 12, but the resin mold 1c, the AC bus bars 13a, 13b, the negative arm N bus bar 12, the control ground terminal 4c, a control gate terminal 5d, a heat-dissipating metal substrate 6c, semiconductor switching elements 7g, 7h, 7i, 7j, and bonding wires 8e, 8f are provided and arrangement of these is the same as in the power semiconductor module 200 according to the second embodiment. Drain electrodes of the semiconductor switching elements 7g, 7h, 7i, 7j are connected to one heat-dissipating metal substrate 6c, and the heat-dissipating metal substrate 6c is connected to the AC bus bars 13a, 13b. Source electrodes 9g, 9h, 9i, 9j of the semiconductor switching elements 7g, 7h, 7i, 7j are connected to one negative arm N bus bar 12, and the negative arm N bus bar 12 is connected to the control ground terminal 4c. The bonding wire 8e is connected to a gate pad 10g of the semiconductor switching element 7g and a gate pad 10h of the semiconductor switching element 7h, and an end of the bonding wire 8e is connected to the control gate terminal 5d. The bonding wire 8f is connected to a gate pad 10i of the semiconductor switching element 7i and a gate pad 10j of the semiconductor switching element 7j, and an end of the bonding wire 8f is also connected to the control gate terminal 5d.

In the lower half of the power semiconductor module 400 according to the fourth embodiment, as compared to the power semiconductor module 200 according to the second embodiment, the P bus bars 2a, 2b are replaced with positive arm P bus bars 11a, 11b, and the N bus bar 3a is replaced with the intermediate bus bar 14, but the resin mold 1c, the positive arm P bus bars 11a, 11b, the intermediate bus bar 14, a control ground terminal 4d, a control gate terminal 5e, a heat-dissipating metal substrate 6d, semiconductor switching elements 7k, 7l, 7m, 7n, and bonding wires 8g, 8h are provided and arrangement of these is the same as in the power semiconductor module 200 according to the second embodiment. Drain electrodes of the semiconductor switching elements 7k, 7l, 7m, 7n are connected to one heat-dissipating metal substrate 6d, and the heat-dissipating metal substrate 6d is connected to the positive arm P bus bars 11a, 11b.

Source electrodes 9k, 9l, 9m, 9n of the semiconductor switching elements 7k, 7l, 7m, 7n are connected to one intermediate bus bar 14, and the intermediate bus bar 14 is connected to the control ground terminal 4d and the heat-dissipating metal substrate 6c. The bonding wire 8g is connected to a gate pad 10k of the semiconductor switching element 7k and a gate pad 10l of the semiconductor switching element 7l, and an end of the bonding wire 8g is connected to the control gate terminal 5e. The bonding wire 8h is connected to a gate pad 10m of the semiconductor switching element 7m and a gate pad 10n of the semiconductor switching element 7n, and an end of the bonding wire 8h is also connected to the control gate terminal 5e.

The semiconductor switching elements 7k, 7l, 7m, 7n are connected in parallel by the heat-dissipating metal substrate 6d and the intermediate bus bar 14, to form a positive arm, and the semiconductor switching elements 7g, 7h, 7i, 7j are connected in parallel by the heat-dissipating metal substrate 6c and the negative arm N bus bar 12, to form a negative arm. The heat-dissipating metal substrate 6c being at a drain potential of the negative arm is connected to the intermediate bus bar 14 being at a source potential of the positive arm, whereby the positive arm and the negative arm are connected to each other using the heat-dissipating metal substrate 6c as a connection point. The AC bus bars 13a, 13b which are AC electrodes are connected to the heat-dissipating metal substrate 6c which is the connection point between the positive arm and the negative arm. The intermediate bus bar 14 is provided so as to overlap the negative arm N bus bar 12, and thus the intermediate bus bar 14 and the negative arm N bus bar 12 form a two-layer structure.

Next, the structure and the effects of the power semiconductor module 400 according to the fourth embodiment will be described. The directions of currents flowing through the intermediate bus bar 14 and the negative arm N bus bar 12 are opposite to each other, and the intermediate bus bar 14 is provided so as to overlap the negative arm N bus bar 12. Therefore, currents flowing through the intermediate bus bar 14 and the negative arm N bus bar 12 act so as to cancel the parasitic inductances. Here, the intermediate bus bar 14 is at the source potential of the semiconductor switching elements 7k, 7l, 7m, 7n, i.e., the ground potential, and thus, when the parasitic inductance of the intermediate bus bar 14 is reduced, current imbalance among the semiconductor switching elements 7k, 7l, 7m, 7n is suppressed. Similarly, the negative arm N bus bar 12 is at the source potential of the semiconductor switching elements 7g, 7h, 7i, 7j, i.e., the ground potential, and thus, when the parasitic inductance of the negative arm N bus bar 12 is reduced, current imbalance among the semiconductor switching elements 7g, 7h, 7i, 7j is suppressed. In addition, when the sum of the parasitic inductances on the P and N sides is reduced, surge voltage due to switching is reduced, whereby further high-speed switching can be performed.

Although the disclosure is described above in terms of various exemplary embodiments, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1, 1a, 1b, 1c resin mold
2, 2a, 2b P bus bar
3, 3a, 3b N bus bar
4, 4a, 4b, 4c, 4d control ground terminal
5, 5a, 5b, 5c, 5d, 5e control gate terminal
6, 6a, 6b, 6c, 6d heat-dissipating metal substrate
7a, 7b, 7c, 7d, 7e, 7f, 7g, 7h, 7i, 7j, 7k, 7l, 7m, 7n semiconductor switching element
8, 8a, 8b, 8c, 8d, 8e, 8f, 8g, 8h bonding wire
9a, 9b, 9c, 9d, 9e, 9f, 9g, 9h, 9i, 9j, 9k, 9l, 9m, 9n source electrode
10a, 10b, 10c, 10d, 10e, 10f, 10g, 10h, 10i, 10j, 10k, 10l, 10m, 10n gate pad
11a, 11b positive arm P bus bar
12 negative arm N bus bar
13a, 13b AC bus bar
14 intermediate bus bar
21a, 21b, 21c, 21d, 21e, 21f P-side parasitic inductance
22, 22a P-side common inductance
23a, 23b, 23c, 23d, 23e, 23f N-side parasitic inductance
24, 24a N-side common inductance
25a, 25b, 25c, 25d, 25e, 25f gate control signal parasitic inductance
26, 26a gate control signal common inductance
27, 27a ground control signal common inductance
28a, 28b P-side primary common inductance
29a, 29b N-side primary common inductance
30a, 30b gate control signal primary common inductance
100, 200, 300, 400 power semiconductor module
1000 reference line

What is claimed is:

1. A power semiconductor module comprising:
   a plurality of semiconductor switching elements each having a first main electrode and a gate pad on a front surface and having a second main electrode on a back surface;
   a bus bar to which each of the first main electrodes of the semiconductor switching elements is joined;
   a heat-dissipating metal substrate to which each of the second main electrodes of the semiconductor switching elements is joined; and
   a control gate terminal connected to each of the gate pads of the semiconductor switching elements only by a bonding wire, wherein
   at least two of the plurality of semiconductor switching elements are arranged adjacently to each other on the heat-dissipating metal substrate and electrically connected in parallel to form one arm,
   the bus bar, the heat-dissipating metal substrate, and the bonding wire are arranged such that a direction of current flowing through the bus bar and a direction of current flowing through the bonding wire are perpendicular to each other, and a direction of current flowing through the heat-dissipating metal substrate and the direction of the current flowing through the bonding wire are perpendicular to each other.

2. The power semiconductor module according to claim 1, wherein
   a distance between nearest points of at least two of the semiconductor switching elements arranged adjacently to each other is 5 mm or less and is greater than 0 mm.

3. The power semiconductor module according to claim 1, wherein
   the gate pads of at least two of the semiconductor switching elements arranged adjacently to each other are connected to one of the plurality of bonding wires, and
   all the bonding wires are connected to the one control gate terminal.

4. The power semiconductor module according to claim 1, wherein
   the gate pads of at least two of the semiconductor switching elements arranged adjacently to each other are connected to one of the plurality of bonding wires, and
   the bonding wires are respectively connected to the different control gate terminals.

5. The power semiconductor module according to claim 1, wherein
   a first semiconductor switching element unit composed of at least two of the semiconductor switching elements arranged adjacently to each other, and a second semiconductor switching element unit composed of at least two of the semiconductor switching elements arranged adjacently to each other, are arranged mirror-symmetrically with respect to a reference line as a symmetry axis.

6. The power semiconductor module according to claim 5, wherein a structure of the bus bar is mirror-symmetric with respect to the reference line as the symmetry axis.

7. The power semiconductor module according to claim 5, wherein a first bonding wire of the bonding wires and a second bonding wire of the bonding wires are arranged mirror-symmetrically with respect to the symmetry axis.

8. The power semiconductor module according to claim 1, further comprising flyback diodes connected in antiparallel to the semiconductor switching elements.

9. The power semiconductor module according to claim 8, wherein the flyback diodes are made of a wide bandgap semiconductor having a wider bandgap than silicon.

10. The power semiconductor module according to claim 9, wherein the wide bandgap semiconductor is silicon carbide, gallium nitride, or diamond.

11. The power semiconductor module according to claim 1, wherein the semiconductor switching elements are made of a wide bandgap semiconductor having a wider bandgap than silicon.

12. The power semiconductor module according to claim 1, comprising two of the arms, wherein one of the arms which serves as a positive arm and the other arm which serves as a negative arm are connected in series to each other, the power semiconductor module further comprising an AC electrode connected to a connection point between the positive arm and the negative arm.

* * * * *